United States Patent
Kaiser et al.

(10) Patent No.: US 6,288,939 B1
(45) Date of Patent: Sep. 11, 2001

(54) CIRCUIT CONFIGURATION FOR MONITORING STATES OF A MEMORY DEVICE

(75) Inventors: Robert Kaiser, Kaufering; Florian Schamberger, Bad Reichenhall, both of (DE)

(73) Assignee: Infineon Technologies, Munich (DE)

( * ) Notice: Subject to any disclaimer, the term of this patent is extended or adjusted under 35 U.S.C. 154(b) by 0 days.

(21) Appl. No.: 09/568,941

(22) Filed: May 11, 2000

(30) Foreign Application Priority Data

May 11, 1999 (DE) .............................. 199 21 868

(51) Int. Cl.⁷ .................................................. G11C 14/00
(52) U.S. Cl. ................................ 365/185.08; 365/185.09; 365/200
(58) Field of Search ............................. 365/200, 185.08, 365/185.33, 185.09, 225.7

(56) References Cited

U.S. PATENT DOCUMENTS

| | | | |
|---|---|---|---|
| 5,313,424 | 5/1994 | Adams et al. | 365/200 |
| 5,677,917 | 10/1997 | Wheelus et al. | 371/22.3 |
| 5,682,345 | * 10/1997 | Roohparvar et al. | 365/185.04 |
| 5,892,712 | * 4/1999 | Hirose et al. | 365/185.07 |
| 6,137,315 | * 10/2000 | Zettler | 326/83 |
| 6,163,480 | * 12/2000 | Hess et al. | 365/185.08 |

FOREIGN PATENT DOCUMENTS

| | | |
|---|---|---|
| 196 39 613 A1 | 8/1997 | (DE) . |
| 197 25 581 A1 | 1/1999 | (DE) . |
| 198 43 470 A1 | 3/2000 | (DE) . |

* cited by examiner

*Primary Examiner*—Richard Elms
*Assistant Examiner*—Hien Nguyen
(74) *Attorney, Agent, or Firm*—Herbert L. Lerner; Laurence A. Greenberg; Werner H. Stemer

(57) ABSTRACT

A circuit configuration has memory devices, each containing a programmable element and a volatile memory element. For each of the memory devices, the programmable element is connected to the volatile memory element to store a state of the programmable element in the volatile memory element. A respective memory device has at least one output for checking the respective state of the programmable element in the associated volatile memory element. The memory devices can be addressed individually via a selection circuit to output the states of the programmable element and of the volatile memory element. The information stored in the volatile memory element is retained in this process.

5 Claims, 3 Drawing Sheets

CIRCUIT CONFIGURATION FOR MONITORING STATES OF A MEMORY DEVICE

BACKGROUND OF THE INVENTION

Field of the Invention

The invention relates to a circuit configuration containing memory devices, which contain programmable elements and volatile memory elements, for monitoring the states thereof.

For repairing faulty memory cells, integrated circuits, particularly integrated memories, have redundant word lines or redundant bit lines, which can replace regular lines containing faulty memory cells on an address basis. In this case, the integrated memory is, by way of example, tested by a self-test device, and the redundant elements are subsequently programmed. A redundancy circuit then has programmable elements, for example in the form of electrical fuses, which are used for storing the address of a line that is to be replaced. The electrical fuses are electrical connection elements whose line resistance can be varied, for example at the end of the process of manufacturing the integrated circuit, by a so-called burning voltage.

U.S. Pat. No. 5,313,424 discloses an integrated memory having a self-repair function. A self-test unit tests the memory cells in the memory and then stores the address of faulty word lines in an appropriate address register. An activation signal with a high potential level is then supplied to the memory from outside, whereupon the severable electrical connection elements (fuses), which are a component part of a redundancy circuit, are destroyed to code the faulty word addresses stored in the address register. In this context, the fuses are destroyed by a high current that causes them to melt.

A further circuit configuration, disclosed in Published, Non-Prosecuted German Patent Application DE 198 43 470 A1, allows external analysis of the faults established. A memory unit for storing the address ascertained by the self-test unit has an output that is connected to a corresponding output of the circuit configuration for outputting the respectively stored address. Hence, if required, the manufacturer of the integrated circuit can establish whether faults have been established during the memory self-test and whether self-repair has been carried out. In addition, the manufacturer can establish the address of the faults established.

A volatile memory unit, such as an address register or address latch, can easily have information written to it by a self-test unit, since no voltages exceeding the normal signal level of the memory or large currents are required for this. The provision of a further, nonvolatile memory unit has the advantage that the memory self-test does not need to be repeated every time the volatile memory unit has lost the address stored in it (for example after the supply voltage has been turned off). If only one volatile memory unit were provided, the address of the normal units to be replaced would otherwise have to be established once again by the self-test (for example whenever the memory is initialized). The address is therefore permanently stored in the nonvolatile memory unit in a further step. To restore the memory content of the volatile memory unit, for example whenever the memory is initialized after the supply voltage is applied, the address stored in the nonvolatile memory unit then needs to be transferred to the volatile memory unit.

Particularly when electrical fuses are used, the burning procedure carried out to program the fuses does not always take place reliably. The transfer procedure carried out to restore the memory content of the volatile memory unit can therefore not always be completed reliably. The result of this is, by way of example, an incorrectly stored address in the volatile memory unit after the transfer procedure. It is therefore desirable to check whether the respective electrical fuse has been set such that the volatile memory element can reconstruct the originally stored information again from the state of the relevant fuse.

In the Published, Non-Prosecuted German Patent Application DE 198 43 470 A1, the output of the first volatile memory unit therein is a serial output for outputting the stored address bit by bit. The advantage of this is that the memory unit has only this one output. However, an associated serial shift procedure results in that the information stored in the volatile memory elements is first erased and, in the case of a shift register with feedback, the originally contained information is restored only after a complete cycle. By contrast, in the case of the present application, it is important for the information stored in the respective volatile memory element to be retained permanently in order to be able to compare it reliably at a later instant with the state reconstructed from the fuse.

SUMMARY OF THE INVENTION

It is accordingly an object of the invention to provide a circuit configuration for monitoring states of a memory device which overcomes the above-mentioned disadvantages of the prior art devices of this general type, in which states of volatile memory elements can be read such that stored information is retained, and which can be checked to determine whether the information originally intended for the volatile memory element can be reconstructed from the state of the associated programmable element.

With the foregoing and other objects in view there is provided, in accordance with the invention, a circuit configuration, containing:
  a plurality of memory devices each including:
    a programmable element having a first output and a second output;
    a volatile memory element having an input and an output; and
    a switching device connecting the first output of the programmable element to the input of the volatile memory element; and
  at least one output terminal for outputting a state of the programmable element and a state of the volatile memory element; and
  a selection circuit connected to the memory devices, the memory devices being individually addressed via the selection circuit to output states of the programmable element and of the volatile memory element.

The circuit configuration has memory devices, each containing the programmable element and the volatile memory element. To store the state of the programmable element in the volatile memory element, for each memory device, an output of the programmable element is connected to an input of the volatile memory element. To check the respective state of the volatile memory element and of the programmable element, the respective memory device has at least one output for outputting the desired state. The memory devices can be addressed individually and directly via the selection circuit to output the states of the respective memory device. Direct access to the respective memory device with its volatile memory element does not change the information in the latter during a read procedure. In addition, direct access to the respective memory device enables faster and more targeted access in comparison with a read method using a serial shift register. On the other hand, it is naturally also possible to write information to the respective memory device directly.

In this manner, a plurality of states of the memory device can also be read in parallel or serially without any significant increase in the additional circuit complexity required for this. If the assessment of the states of the volatile memory element and of the programmable element in the same memory device uncovers a fault in the programming already carried out for the programmable element, suitable measures can be used to react to this. Such a measure may be, by way of example, a new programming procedure for the same programmable element or may also involve the appropriate circuit part being marked as faulty.

In one development of the invention, the circuit configuration has a further volatile memory element, which is connected to the output for outputting the state of the programmable element in one of the memory devices in order to store the state of the programmable element temporarily. The output of the further volatile memory element and the output for outputting the state of the volatile memory element in the memory device which is to be checked are connected to a comparison device which compares the signals present at the respective outputs. The information stored in the volatile memory element is retained in this process. Provision of the further volatile memory element has the advantage that the information stored in the programmable element is read using comparable technical devices, as in the case of the procedure for transferring the state of the programmable element to the associated volatile memory element. The states of the further volatile memory element and of the volatile memory element that is to be monitored can be compared directly at the outputs of the memory elements. Since only one further volatile memory element is provided as a reference element, which is connected to the respective memory device to be tested, the additional circuit complexity is kept low. However, in this connection, it is also possible to provide a reference element for each memory device to be tested.

It is particularly advantageous if the further volatile memory element and the volatile memory element in the memory device to be tested have essentially the same configuration. This improves the results at the output of the comparison device again.

In one refinement of the programmable elements, the programmable elements have electrically programmable fuses. Versions having laser fuses are also conceivable. In the former case, the programmable elements can be programmed using an externally applied burning voltage on the housed semiconductor module at the end of the manufacture of the integrated circuit.

The memory devices can be addressed by the selection circuit in a similar manner to addressing memory cells in conventional semiconductor memories, for example. In this context, the memory devices are combined to form addressable units. One of the units is accessed by a first part of address bits in an applied address, and one of the memory devices within the respective unit is accessed by a second part of address bits in the same address. This is essentially equivalent to the addressing practiced in customary semiconductor memories using row and column addresses.

The invention is suitable for any circuits containing memory devices that contain programmable elements and associated volatile memory elements. In particular, the circuit configuration according to the invention can be used in an integrated semiconductor memory that has memory cells that are combined to form individually addressable normal units and addressable redundant units for replacing one of the normal units. The normal and redundant units can be word lines or bit lines or entire memory blocks of the memory, for example. The integrated memory can be, by way of example, a writable memory, such as a DRAM, SRAM, flash memory or EEPROM. Such a semiconductor memory also has a memory unit, containing a plurality of the memory devices, for storing an address for the normal unit that is to be replaced by the redundant unit. In this case, each of the memory devices stores one of a plurality of address bits in the applied address. The circuit configuration according to the invention can be used to check the respective address, after it has been programmed, to determine whether the programming procedure has been carried out correctly.

With the foregoing and other objects in view there is provided, in accordance with the invention, an integrated semiconductor memory, containing:
 a plurality of memory cells combined to form individually addressable normal units;
 a plurality of further memory cells combined to form at least one addressable redundant unit for replacing one of the addressable normal units;
 a memory unit having a plurality of memory devices for storing an address of the addressable normal units to be replaced by the addressable redundant unit, the memory devices each including:
  a programmable element having a first output and a second output;
  a volatile memory element having an input and an output;
  a switching device connecting the first output of the programmable element to the input of the volatile memory element; and
  at least one output terminal for outputting a state of the programmable element and a state of the volatile memory element.

Other features which are considered as characteristic for the invention are set forth in the appended claims.

Although the invention is illustrated and described herein as embodied in a circuit configuration for monitoring states of a memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
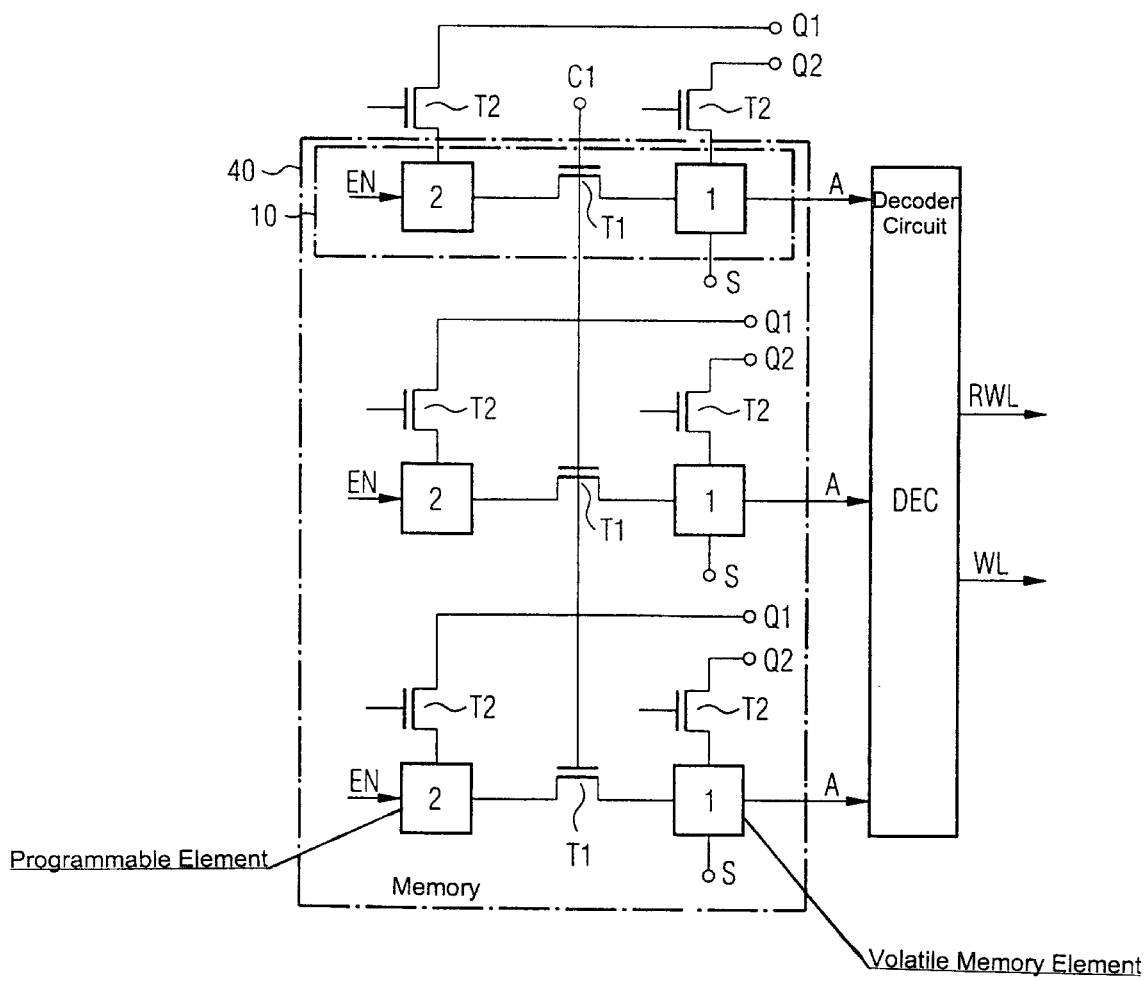
FIG. 1 is a block circuit diagram of a layout of a circuit configuration according to the invention.

In all the figures of the drawing, sub-features and integral parts that correspond to one another bear the same reference symbol in each case. Referring now to the figures of the drawing in detail and first, particularly, to FIG. 1 thereof, there is shown a circuit configuration containing memory devices 10, each having a programmable element 2 and a volatile memory element 1. For each memory device 10, an output of the programmable element 2 is connected to an input of the volatile memory element 1 via a switching device T1, preferably a transistor, to store a state of the programmable element 2 in the volatile memory element 1. In this configuration, the transistors T1 are driven by a control signal C1. The programming procedure for a respective programmable element 2 is carried out by an activation signal EN. A state of the programmable element 2 and of the volatile memory element 1 can be obtained at outputs Q1 and Q2 via transistors T2.

The circuit configuration shown in FIG. 1 is part of an integrated semiconductor memory. In this case, the memory devices 10 all together form a memory unit 40, which, by way of example, stores an address for a normal faulty unit that is to be replaced. The address is passed via outputs A to a decoder circuit DEC, which replaces the faulty normal unit, for example a word line WL, with a redundant unit, for example a redundant word line RWL.

Figure 2:
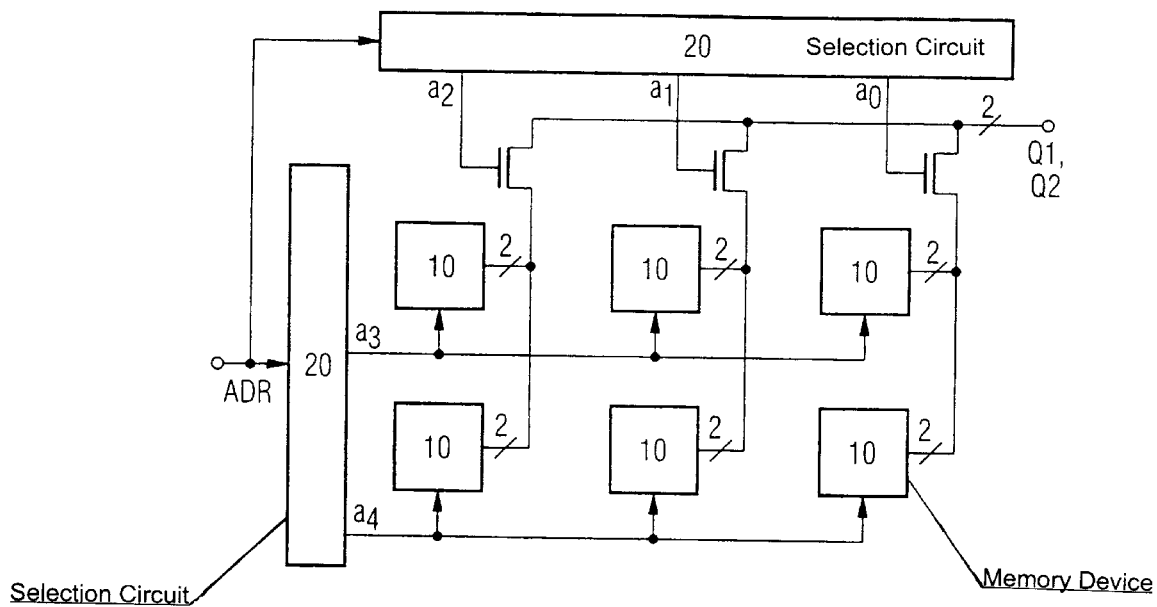
FIG. 2 is a block circuit configuration containing a plurality of memory devices that can be addressed via a selection circuit.
Figure 3:
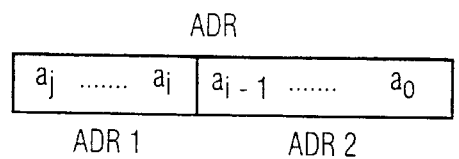
FIG. 3 is an illustration of an address made up of address bits.

FIG. 2 shows a circuit configuration containing a plurality of the memory devices 10 that can be addressed via a selection circuit 20. In this configuration, one of the memory devices 10 is accessed, using an applied address ADR, by a first address part ADR1, which in this case is made up of the more significant address bits a3 and a4 in the address ADR, and by a second address part ADR2, which in this case is made up of the less significant address bits a0 to a2 in the address ADR. The division of the address ADR into its first address part ADR1 and its second address part ADR2 is shown generally in FIG. 3 for clarification purposes.

Figure 4:
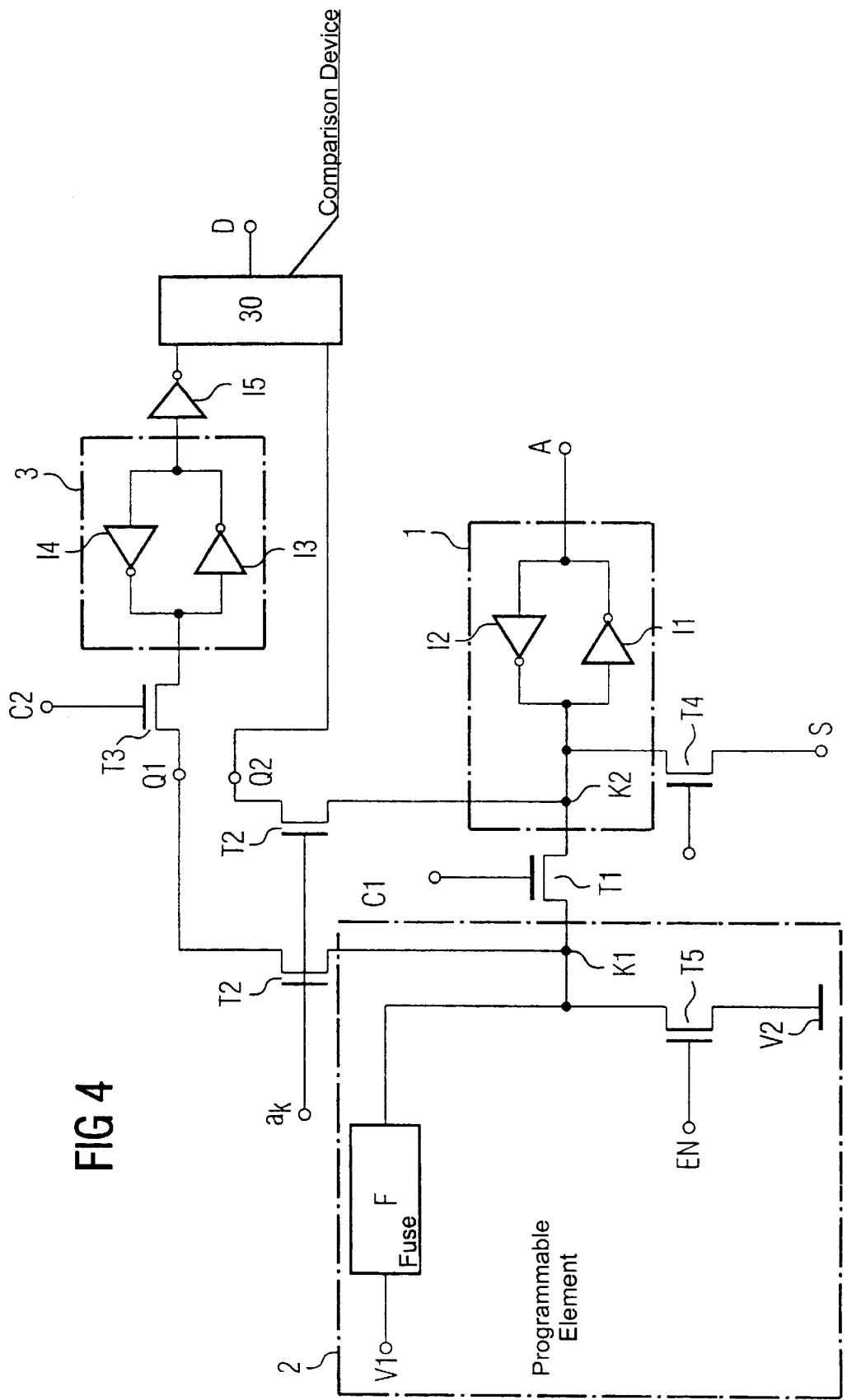
FIG. 4 is a circuit diagram of a memory device from FIG. 1 with a reference element.

FIG. 4 shows an illustrative embodiment of the memory device 10 from FIG. 1 having a further volatile memory element 3, and a comparison device 30 that is connected to the latter and to an output Q2 of the memory device 10. The programmable element 2 contains an electrical fuse F which is connected to a potential V1, on the one hand, and, on the other hand, to a transistor T5, whose activation signal EN is used to initiate a burning procedure. During programming, the potential V1 is equivalent to a burning voltage VBURN, for example. If, in one type of implementation, the fuse F has a low resistance when unprogrammed, a high current flows from the connection for the potential V1 to the connection for the potential V2, which is equivalent to a reference-ground potential, for example. The high current causes the electrical fuse F to melt. The volatile memory element 1 is formed from a hold circuit that has inverters I1 and I2. The output-side connection of the fuse F and the input of the hold circuit are connected to one another via the transistor T1.

States of nodes K1 and K2 can be obtained at the outputs Q1 and Q2 via the transistors T2. As regards addressing using the address ADR from FIG. 3, the transistors T2 are driven by a signal ak, which is equivalent to a selected address bit. In the example shown in FIG. 2, the address bit ak is equivalent to one of the address bits a3 or a4.

Connected to the connection Q1 via the transistor T3 is the further volatile memory element 3, which, like the volatile memory element 1, is formed by a hold circuit which has an inverter I3 and an inverter I4 which are disposed back to back. The output of the hold circuit is connected to the comparison device 30 via an inverter I5. A second connection of the comparison device 30 is connected to the connection Q2. Examples of suitable versions of the comparison device 30 are XOR gates or XNOR gates.

The way in which the circuit configuration shown in FIG. 4 works is explained below.

The volatile memory element 1 receives a signal S via the transistor T4, so that the node K2 assumes a state of the signal S. So-called soft setting of the node K2 takes place. The state is then permanently stored, in a second step, in the programmable element 2 as a result of the transistor T5 being appropriately driven. Following a redundancy analysis, for example, the circuit is isolated from the supply voltage, whereupon the content of the volatile memory element 1 is lost, but the electrical fuse F does not change its state. To restore the memory content of the volatile memory element 1, for example during initialization of the circuit after the supply voltage is applied, the information stored in the programmable element 2 is then transferred to the volatile memory element 1 via the transistor T1.

If the fuse F has been programmed incompletely, it is possible that the hold circuit in the volatile memory element 1 will not read the state at the node K1 correctly when the state is transferred, and consequently an incorrect state will be stored. This is particularly critical if the reference potential at the node K2 approaches the threshold voltage of the inverters I1 and I2. If the second step (outlined above) in programming the fuse F has taken place and the supply voltage has been disconnected, there is no longer any existing information about whether the item of data stored in the volatile memory element 1 matches the original soft setting, since the latter information has been lost.

Provision is therefore made for a comparison to be carried out using the states of the nodes K1 and K2 before the supply voltage is disconnected and before the information stored in the fuse F is transferred. The comparison indicating whether the fuse F of the programmable element 2 has been set such that the volatile memory element 1 can reconstruct again the information originally stored during soft setting from the state of the fuse F. To this end, the state of the node K1 is supplied via the connection Q1 and the transistor T3 to the further volatile memory element 3, which advantageously has essentially the same configuration as the volatile memory element 1. The state at the node K2 and the state present at the output of the inverter I5 connected to the further volatile memory element 3 are evaluated by the comparison device 30, at the output D thereof.

In other words, a check is made to determine whether burning of the fuse F was successful. If this check shows that the state at the output of the inverter I5 and the state at the node K2 do not match, then it can be assumed that the information stored by the soft setting in the volatile memory element 1 cannot be reconstructed without faults using the state of the programmable element 2. The further volatile memory element 3 is therefore used to simulate the later procedure of storing the state of the programmable element 2 in the volatile memory element 1. While the state at the node K2 is being read via the transistor T2, the information stored in the volatile memory element 1 with the aid of soft setting is retained.

We claim:

1. A circuit configuration, comprising:
    a plurality of memory devices each including:
        a programmable element having a first output and a second output;
        a volatile memory element having an input and an output; a switching device connecting said first output of said programmable element to said input of said volatile memory element; and
        two output terminals including a first output terminal connected to said programmable element for outputting a state of said programmable element and a second output terminal connected to said volatile memory element for outputting a state of said volatile memory element;

a selection circuit connected to said memory devices, said memory devices being individually addressed via said selection circuit to output states of said programmable element and of said volatile memory element;

a further volatile memory element having an output and an input connected to said first output terminal for storing the state of said programmable element in said further volatile memory element; and a comparison device connected to said output of said further volatile memory element and to said second output terminal, said comparison device comparing signals present at said output of said further volatile memory element and said second output terminal.

2. The circuit configuration according to claim 1, wherein said further volatile memory element and said volatile memory element have equivalent circuit configurations.

3. A circuit configuration, comprising:

a plurality of memory devices each including:
   a programmable element having a first output, a second output, and an electrically programmable fuse;
   a volatile memory element having an input and an output;
   a switching device connecting said first output of said programmable element to said input of said volatile memory element; and
   at least one output terminal for outputting a state of said programmable element and a state of said volatile memory element; and a selection circuit connected to said memory devices, said memory devices being individually addressed via said selection circuit to output states of said programmable element and of said volatile memory element.

4. A circuit configuration, comprising:

a plurality of memory devices each including:
   a programmable element having a first output and a second output;
   a volatile memory element having an input and an output;
   a switching device connecting said first output of said programmable element to said input of said volatile memory element; and
   at least one output terminal for outputting a state of said programmable element and a state of said volatile memory element; and a selection circuit connected to said memory devices, said memory devices being individually addressed via said selection circuit to output states of said programmable element and of said volatile memory element, said memory devices combined to form addressable units and connected to said selection circuit such that access to one of said addressable units can be controlled by a first part of address bits in an address, and access to said one of said memory devices within a respective addressable unit can be controlled by a second part of address bits in the address.

5. An integrated semiconductor memory, comprising:

a plurality of memory cells combined to form individually addressable normal units;

a plurality of further memory cells combined to form at least one addressable redundant unit for replacing one of said addressable normal units;

a memory unit having a plurality of memory devices for storing an address of said addressable normal units to be replaced by said addressable redundant unit, said memory devices each including:
   a programmable element having a first output and a second output;
   a volatile memory element having an input and an output;
   a switching device connecting said first output of said programmable element to said input of said volatile memory element; and
   at least one output terminal for outputting a state of said programmable element and a state of said volatile memory element.

* * * * *